US008188456B2

(12) United States Patent
Nemanich et al.

(10) Patent No.: US 8,188,456 B2

(45) Date of Patent: May 29, 2012

(54) THERMIONIC ELECTRON EMITTERS/COLLECTORS HAVE A DOPED DIAMOND LAYER WITH VARIABLE DOPING CONCENTRATIONS

(75) Inventors: Robert J. Nemanich, Tempo, AZ (US); Franz A. M. Koeck, Tempe, AZ (US)

(73) Assignee: North Carolina State University, Raleigh, NC (US)

( * ) Notice: Subject to any disclaimer, the term of this patent is extended or adjusted under 35 U.S.C. 154(b) by 1022 days.

(21) Appl. No.: 12/029,602

(22) Filed: Feb. 12, 2008

(65) Prior Publication Data

US 2011/0221328 A1 Sep. 15, 2011

Related U.S. Application Data

(60) Provisional application No. 60/900,849, filed on Feb. 12, 2007.

(51) Int. Cl.
*H01L 29/06* (2006.01)

(52) U.S. Cl. ..... 257/10; 257/11; 257/407; 257/E21.395; 438/20

(58) Field of Classification Search ........................ None
See application file for complete search history.

(56) References Cited

U.S. PATENT DOCUMENTS

| | | | | |
|---|---|---|---|---|
| 5,631,196 | A * | 5/1997 | Kane et al. | 438/20 |
| 5,944,573 | A * | 8/1999 | Mearini et al. | 445/50 |
| 6,489,704 | B1 * | 12/2002 | Kucherov et al. | 310/306 |
| 2003/0001490 | A1 * | 1/2003 | Yamamoto et al. | 313/495 |
| 2008/0042144 | A1 * | 2/2008 | Tatsumi et al. | 257/77 |

* cited by examiner

*Primary Examiner* — Thomas L Dickey
*Assistant Examiner* — Scott R Wilson
(74) *Attorney, Agent, or Firm* — Myers Bigel Sibley & Sajovec

(57) ABSTRACT

A thermionic electron emitter/collector includes a substrate and a doped diamond electron emitter/collector layer on the substrate. The doped diamond electron emitter/collector layer has at least a first and a second doping concentration as a function of depth such that the first doping concentration is different from the second doping concentration.

47 Claims, 6 Drawing Sheets

THERMIONIC ELECTRON EMITTERS/COLLECTORS HAVE A DOPED DIAMOND LAYER WITH VARIABLE DOPING CONCENTRATIONS

RELATED APPLICATIONS

This application claims priority to U.S. Provisional Application Ser. No. 60/900,849 filed Feb. 12, 2007, the disclosure of which is hereby incorporated by reference in its entirety.

STATEMENT OF GOVERNMENT SUPPORT

This invention was made with Government support under grant number N00014-03-1-0790 from the Office of Naval Research. The Government has certain rights to this invention.

FIELD OF THE INVENTION

The present invention relates to electron emitters, and more particularly to thermionic electron emitters/collectors.

BACKGROUND

Thermionic electron emitters are devices in which electrons are thermionically emitted from the surface of a material upon the application of heat energy. Thermionic electron emitters can be used to provide a current, as electron beam sources (for example, in televisions or computer monitors), microwave generators, thermionic generators, vacuum diode heat pumps, amplifiers for broadcasting, electron microscopes and electron sources employed in propulsion systems, for example, as are used in spacecraft propulsion systems.

For example, thermionic energy conversion is a technique in which heat energy is converted to electrical energy by thermionic emission. Electrons are thermionically emitted from the surface of a material, such as a metal, by heating the metal. Sufficient energy is imparted to a portion of the electrons to overcome retarding forces at the surface of the metal so that these electrons are emitted at the surface of the metal. In contrast to many other techniques of generating electrical energy, thermionic conversion typically does not require an intermediate form of energy or a working fluid to convert heat into electricity.

Thermionic energy converters typically include an emitter electrode connected to a heat source and a collector electrode connected to a heat sink. The electrodes are separated by a space or gap, and leads connect the electrodes to an electrical load. The space between the electrodes is typically either under vacuum or filled with a suitable vapor. The heat source supplies heat to raise the temperature of the emitter electrode to a sufficiently high temperature so that the electrons are thermionically emitted into the gap and then onto the collector electrode. The electrons are captured at the collector electrode and return to the emitter electrode via the leads and the electrical load between the emitter and the collector.

The emitter electrode or cathode typically has a relatively low electron work function to allow emission of the electrodes. The performance of thermionic energy converters may be limited by the work function of the materials from which the emitters are made and the space charge effect. In other words, the presence of charged electrons in the space between the emitter and the collector can create an extra potential barrier that reduces the thermionic current.

For example, thermionic energy converters typically utilize planar metal based emitters, which may result in high operating temperatures as well as performance limitations due to space charge effects. The high operation temperature of these systems may limit their applications.

SUMMARY OF EMBODIMENTS ACCORDING TO THE INVENTION

According to embodiments of the invention, a thermionic electron emitter or collector includes a substrate and a doped diamond electron emitter/collector layer on the substrate. The doped diamond electron emitter/collector layer has at least a first and a second doping concentration such that the first doping concentration is different from the second doping concentration.

According to some embodiments of the present invention, methods of forming a thermionic emitter/collector emitter include forming a doped diamond electron emitter/collector layer on a substrate. The doped diamond electron emitter/collector layer includes a first doping concentration and a second doping concentration as a function of depth such that the first doping concentration is different from the second doping concentration.

According to some of the invention, a thermionic electron emitter or collector includes a substrate and a doped boron nitride electron emitter/collector layer on the substrate. The doped boron nitride electron emitter/collector layer has at least a first and a second doping concentration such that the first doping concentration is different from the second doping concentration.

DETAILED DESCRIPTION OF THE EMBODIMENTS OF INVENTION

Figure 1A:
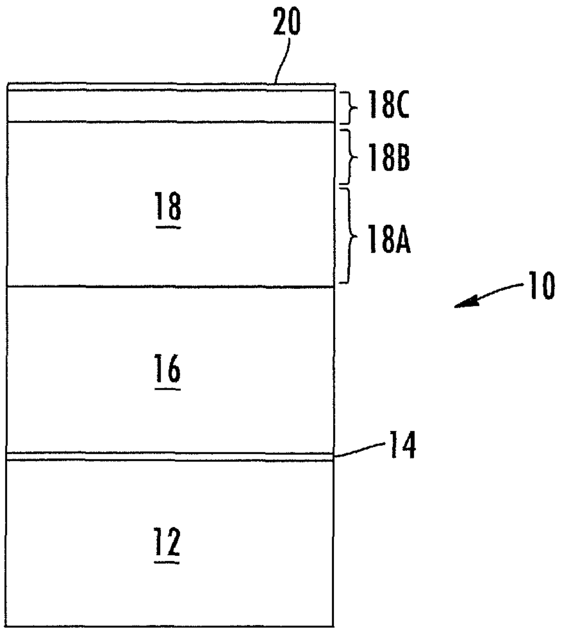
FIG. 1A is a schematic diagram of a thermionic emitter/collector according to embodiments of the present invention.

The present invention now will be described hereinafter with reference to the accompanying drawings and examples, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise. Thicknesses of layers may be exaggerated for clarity.

The terminology used herein is for the purpose of describing particular embodiments only and is not intended to be limiting of the invention. As used herein, the singular forms "a", "an" and "the" are intended to include the plural forms as well, unless the context indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of "over" and "under". The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a "first" element, component, region, layer or section discussed below could also be termed a "second" element, component, region, layer or section without departing from the teachings of the present invention. The sequence of operations (or steps) is not limited to the order presented in the claims or figures unless specifically indicated otherwise.

According to embodiments of the invention, a thermionic electron emitter or collector includes a substrate and a doped diamond electron emitter/collector layer on the substrate. The doped diamond electron emitter/collector layer has at least a first and a second doping concentration such that the first doping concentration is different from the second doping concentration. In some embodiments, the doping concentrations may be achieved with different doping species (i.e. nitrogen, sulfur, phosphorus, lithium etc.). In particular embodiments, the electron emitter includes a passivation layer on the doped diamond electron emitter layer opposite the substrate. The passivation layer can provide a surface termination having a negative electron affinity (NEA).

As illustrated in FIG. 1A, a thermionic electron emitter/collector 10 includes a substrate 12, an interface 14, a nucleation layer 16, a doped diamond layer 18, and a surface treatment layer 20. The doped diamond layer 18 can include sublayers 18A, 18B and 18C, and each of the sublayers 18A, 18B and 18C can have a different doping concentration.

The sublayers 18A, 18B and/or 18C can be configured with respect to thickness, doping concentration and/or doping gradient for an increased electron emission current, i.e., for a low effective work function and high Richardson's constant. The doping concentrations of the sublayers 18A, 18B and/or 18C can be different from one another, and the doping concentrations may range from about $10^{17}$ $cm^{-3}$ to about $10^{21}$ $cm^{-3}$ and the total thickness of the doped diamond/nucleation layer structure of the layer 18 may be about 0.3 μm or less.

The passivation or surface treatment layer 20 can include hydrogen, deuterium and/or metal and can induce a negative electron affinity at the surface of the diamond layer 18. The layer 20 can include a dipole layer which is induced by the heteropolar carbon-hydrogen bonds of the surface atoms. As a result, the vacuum level can be pulled below the conduction band minimum (CBM) at the surface of the layer 20.

For example, if the doped diamond layer 18 is an electron emitter, the doping concentration of the sublayer 18C at the emitter surface can be selected to decrease the effective work function and increase the Richardson's constant of the diamond, e.g., with a doping concentration of between about $10^{17}$ $cm^{-3}$ and $10^{19}$ $cm^{-3}$. The doping concentration of the sublayer 18A adjacent the substrate 12 can be selected to facilitate electron movement into the layer 18, e.g., with a doping concentration of between about $10^{18}$ $cm^{-3}$ and $10^{21}$ $cm^{-3}$. In some embodiments, the doping concentration of the sublayer 18A adjacent the substrate 12 can be higher than the doping concentration of the sublayer 18C adjacent the surface of the layer 18. In some embodiments, two or more different doping species (i.e. nitrogen, sulfur, phosphorus, lithium etc.) can be used in the layers 18A, 18B and 18C. In this configuration, the energy barrier for electron emission (i.e. work function) can be reduced. In some embodiments, electrons are emitted at temperatures of about 700 K or, in some embodiments, 600 K or less. In particular embodiments, current densities range from about 2 $\mu A/cm^2$ at about 700 K to about 50 $\mu A/cm^2$ at about 760 K. In some embodiments, greater current densities may be achieved.

In some embodiments according to the invention, the passivation layer 20 includes hydrogen, deuterium and/or a metal or metal oxide. For example, the passivation layer 20 can induce a negative electron affinity at the diamond layer 18 surface by providing a dipole layer, which is induced by the heteropolar carbon-hydrogen bonds of the surface atoms.

In particular embodiments, the substrate 12 includes a metal, such as molybdenum and/or tungsten. In other embodiments, the substrate 12 includes silicon.

Thermionic electron emitters according to embodiments of the present invention may optionally include a nucleation layer 16, such as a graphitic and/or ultra-nanocrystalline diamond layer, between the doped diamond electron emitter layer 18 and the substrate 12. An optional low electrical resistivity interfacial layer 14 (e.g., carbide, ultra-nanocrystalline diamond) may be formed between the nucleation layer 16 and substrate 12.

The doped diamond electron emitter layer 18 may be formed by chemical vapor deposition (CVD). Other suitable deposition techniques may be used, such as pulsed laser deposition, molecular beam deposition, and sputter deposition or related techniques. The doping concentration can vary at different depths/regions within the doped diamond electron emitter layer, for example, by modifying a concentration of the dopant (e.g., nitrogen gas or other suitable gas that leads to the incorporation of a dopant species into the diamond film) during formation of the diamond film layer. The dopant species can include nitrogen atoms or other species (such as sulfur atoms, phosphorus atoms, lithium atoms, or other species or combinations thereof).

In some embodiments, the diamond layer 18 is provided with varying doping concentrations at the different sublayers 18A, 18B and 18C (i.e., a doping gradient) with the passivation layer 20 or surface termination inducing a negative electron affinity (NEA). Doped diamond layers according to embodiments of the invention can be used to improve existing thermionic electron emission devices, e.g., as a coating, and/or to design new devices that utilize the strongly enhanced electron emission properties at low temperatures. Although the diamond layer 18 in FIG. 1A includes three sublayers 18A, 18B and 18C of different doping concentrations, it should be understood that two or three or more doping concentrations may be used according to some embodiments of the present invention. For example, the first layer may be doped with phosphorus at a concentration of about 1 to $5\times10^{20}$ $cm^{-3}$, the second layer may be doped with nitrogen at a concentration of about $5\times10^{19}$ $cm^{-3}$, and the third layer may be doped with nitrogen at a concentration of about $1\times10^{19}$ $cm^{-3}$.

In some embodiments, the diamond layer 18 can have a Richardson constant of greater than 1 $A/cm^2K^2$ and/or a work function that is less than 2 eV.

Although embodiments according to the invention are described herein with respect to electron emitters, it should be understood that doped diamond layers described herein may be used as electron collectors, e.g., anodes and/or cathodes.

Without wishing to be bound by theory, when the substrate 12 is heated, the diamond electron emitter layer 18 may promote electrons into the conduction band at relatively low temperatures due to the reduced effective work function of the doping configuration of the diamond layer and/or the NEA, which releases electrons.

Figure 1B:
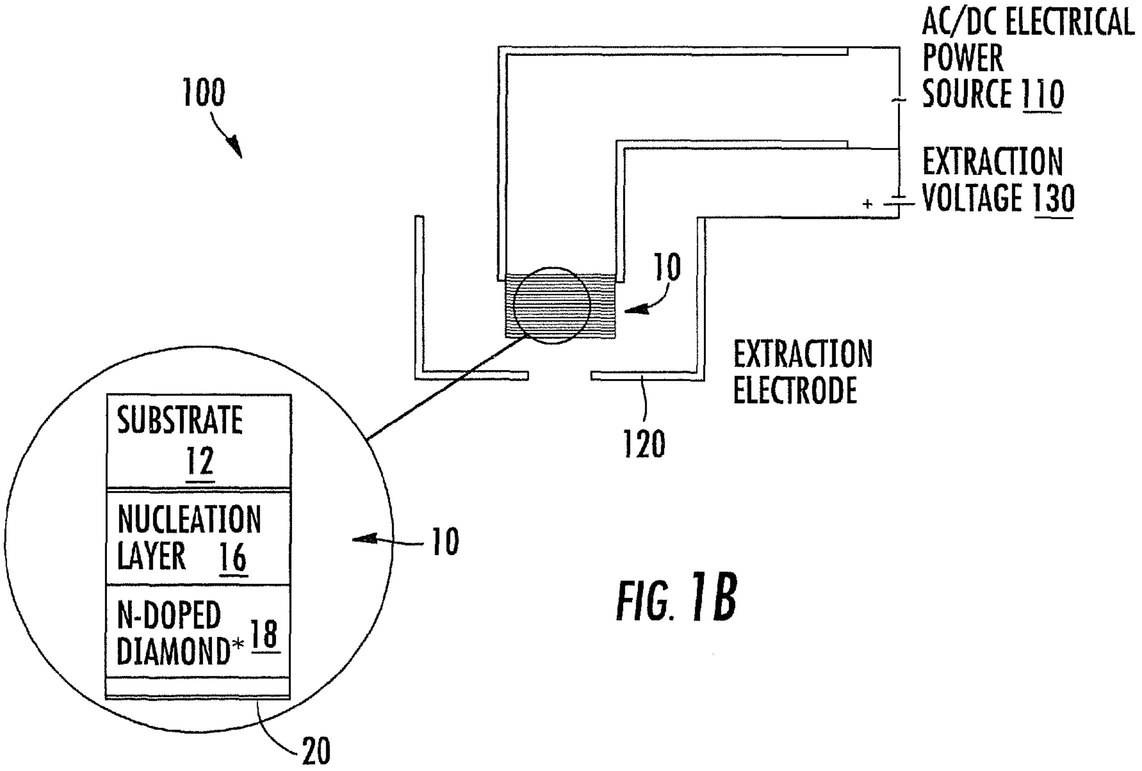
FIG. 1B is a schematic diagram of an electron source device using the thermionic emitter/collector of FIG. 1A.

With reference to FIG. 1B, a thermionic electron source 100 according to embodiments of the present invention is shown. The electron source 100 includes an electrical power source 110, an extraction electrode or collector 120 and an electron emitter 10. The substrate 12 of the emitter 10 can be heated, e.g., by passing an electric current through the substrate 12 using the power source 110. Other suitable heating techniques can be used, such as radiatively heating by an external source. Electrons from the emitter 10 are collected on the collector 120. As illustrated, the heated, diamond coated thermionic emitter 10 can provide an electron source by promoting electrons into the conduction band, e.g., at relatively low temperatures due to the relatively small effective work function and the negative electron affinity releasing the electrons into vacuum. By applying an electric field between the emitter 10 and the collector 120, the emission current can be further increased as shown in FIG. 1B.

Figure 2:
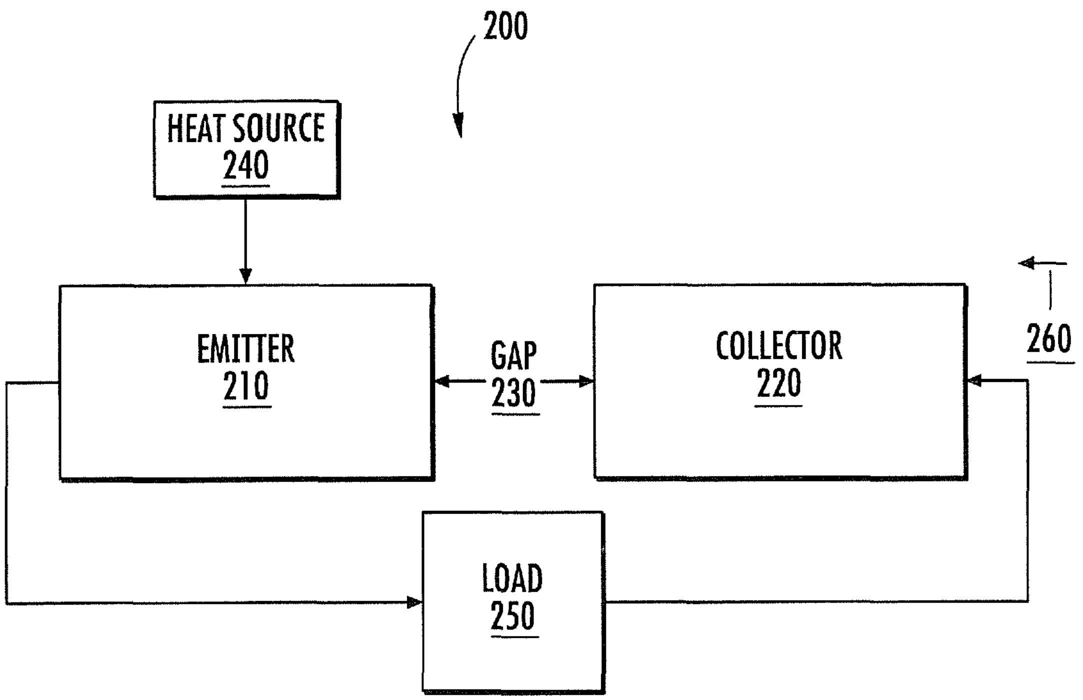
FIG. 2 is a schematic diagram of a thermionic energy converter with a doped diamond emitter and/or collector according to embodiments of the present invention.

As shown in FIG. 2, a thermionic energy converter (TEC) 200 includes an emitter 210 and a collector 220 separated by a gap 230. The emitter 210 is in thermal communication with a heat source 240. The emitter 210 and the collector 220 are connected by an electric load 250 to provide a current 260. The emitter 210 and/or the collector 220 can include a doped diamond layer on a substrate, such as is illustrated with respect to the diamond layer 18 and substrate 12 of the emitter collector 10 of FIG. 1A. The application of heat by the heat source 240 to the emitter 210 can promote electrons into the conduction band of the emitter 210 and, consequently, convert the thermal energy into the electrical current 260. Any suitable heat source can be used. For example, the heat source could be steam or a fluid from a power generating plant, concentrated solar radiation, excess heat from an engine, direct radiation from burning fuel, or any suitable radiative source with the capability to heat the emitter substrate. As discussed above, the heat could be generated using an electrical signal through the substrate.

Although embodiments according to the present invention are discussed above with respect to an electron source 100 in FIG. 1B and a thermionic energy converter 200 in FIG. 2, it should be understood that the emitter and collector configurations described herein can be used in any suitable application. Thermionic electron emitters according to embodiments of the present invention can be used to provide a current, as electron beam sources (for example, in televisions or computer monitors), microwave generators, thermionic generators, vacuum diode heat pumps, amplifiers for broadcasting, electron microscopes and electron sources employed in propulsion systems, for example, as are used in spacecraft propulsion systems. Examples of electron emitter configurations in which emitters according to the current invention may be employed are described, for example, in U.S. Pat. Nos. 6,563,256; 6,214,651; 6,091,186; 5,821,680; and 5,684.360 the disclosures of which are incorporated by reference in their entireties.

Moreover, although embodiments of the current invention are described herein with respect to a doped diamond layer having at least first and second doping concentrations, boron nitride may be used instead of a diamond layer. Accordingly, emitters and collectors according to embodiments of the present invention can include a boron nitride layer having at least first and second doping concentrations as a function of depth such that the first and second doping, concentrations are different as described with respect to the diamond layers herein. The n-type doping of boron nitride may be achieved with carbon, silicon, or germanium or oxygen, sulfur, or selenium other species.

Embodiments according to the invention will now be described with respect to the following non-limiting examples.

EXAMPLE 1

Multilayer nitrogen (N)-doped diamond films are grown on 25 mm diameter Si <100> substrates with low resistivity (e.g., <about 1 Ω·cm). Molybdenum, SIC and other conducting substrates can also be used. Sample preparation starts with ultrasonic abrasion for 30-180 min in a diamond/zirconium powder methanol suspension with a diamond powder grain size of less than about 1 μm and a metal powder grain size significantly larger (e.g., <50 μm). The diamond and/or metal powder may be substituted by a nanodiamond powder with grain sizes of typically 5 nm. The substrate is then rinsed with Acetone and/or Methanol and dried with nitrogen gas.

As for the process gases, research grade $N_2$, $H_2$, $CH_4$ and/or other carbon containing sources are used. $N_2$, $NH_3$ or other dopant sources may also be used.

The growth of multilayer N-doped diamond films may be divided into three steps:

(i) Establishing the nucleation layer (ii) N-doped diamond film growth with varying nitrogen concentrations resulting in a multilayer structure (iii) surface treatment.

For the nucleation layer, a high $sp^2$ carbon containing film (such as graphite) is grown until the desired film thickness is reached by monitoring the interference pattern of a reflected laser, e.g. the LRI (laser reflectance interferometry) signal. The growth conditions for the nucleation layer may be about 180 sccm $H_2$, about 20 sccm $CH_4$, a chamber pressure of about 20 Torr, a substrate temperature of about 700-750° C. and a microwave power of about 600 W. A thickness of the nucleation layer is ≦about 300 nm. After deposition of the nucleation layer, the flow rates of the process gases are changed to about 437 sccm $H_2$, about 2.5 sccm $CH_4$ and about 60 sccm for $N_2$. A thickness of this initial nitrogen doped diamond layer is monitored by the LRI signal and may be between about 10 nm to 100 nm and provides a dopant concentration of between about $10^{17}$ $cm^{-3}$ to $10^{21}$ $cm^{-3}$. After deposition of the initial N-doped diamond layer the nitrogen concentration in the gas phase is adjusted continuously to provide a multilayer structure, for example, as shown in FIG. 1A. For example, a second concentration of n-doped diamond may be formed at flow rates of about 60 sccm to 100 sccm of $N_2$, about 437 sccm $H_2$, and about 2.5 sccm $CH_4$, and the thickness at such concentration may be between about 10 nm to 100 nm. A third concentration of n-doped diamond may then be formed at flow rates of about 100 sccm to 60 sccm of $N_2$, about 437 sccm $H_2$, and about 2.5 sccm $CH_4$, and the thickness at such doping concentrations may be between about 10 nm to 50 nm.

It should be understood that the doping concentration can be changed at various rates. Variable doping can continuously vary with depth, can include discontinuous junctions, or can be monotonic (increasing or decreasing) or non-monotonic as a function of depth. The doping rate change includes, but is not limited to, a change in the nitrogen gas flow rate and control of the rate change to establish a doping gradient during film growth. For the nitrogen-doped diamond film the growth temperature is increased to about 850 to 950° C. and the chamber pressure increased to about 50 Torr, and the microwave power is increased to about 1300 W. For an optional surface treatment, the microwave power is reduced to about 600 W and the substrate temperature is reduced to about 700 to 750° C. with only hydrogen gas flowing through the reactor. The diamond film is then treated with $H_2$ or $D_2$ plasma for about 30 sec to 2 min at a pressure of about 20 Torr. Sample preparation is terminated by shutting off the gas flow, microwave and heater power simultaneously and evacuating the growth chamber.

Additional surface preparation can include a topical metal layer with a thickness of about 3 to 10 Å.

Figure 3:
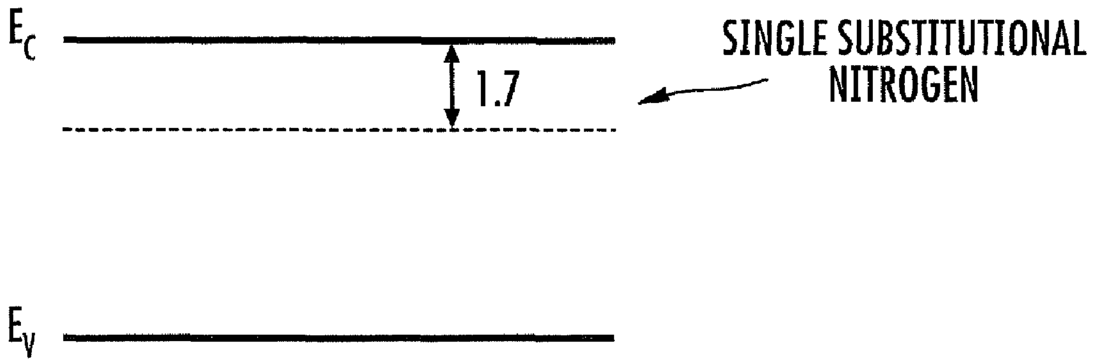
FIG. 3 is a diagram of the single substitutional nitrogen donor energy levels in an N-doped diamond surface according to embodiments of the present invention.

Nitrogen in N-doped diamond films forms single substitutional states 1.7 eV below the conduction band minimum. Thermionic excitation promotes electrons into the conduction band from where they can be released into vacuum, e.g., due to the negative electron affinity of the surface treated N-doped diamond surface. In FIG. 3, a schematic diagram of the nitrogen donor level is shown. The donor levels of other dopant species may be different without departing from the scope of the invention. As illustrated in FIG. 3, nitrogen forms single substitutional donor states in diamond at 1.7 eV below the conduction band minimum.

Figure 4:
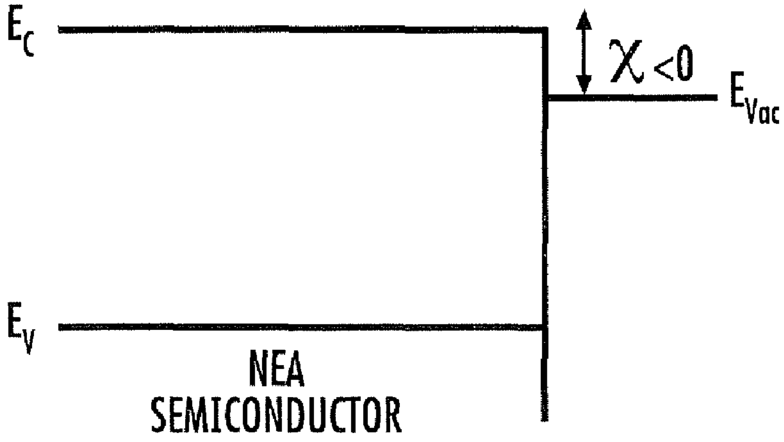
FIG. 4 is a diagram of the energy levels of the band structure of a negative electron affinity semiconductor according to embodiments of the present invention.

The electron affinity is defined as the energy required to remove an electron from the conduction band minimum to a distance far from the semiconductor. Passivation of the diamond surface that induces a negative electron affinity (χ) enhances electron emission due to the reduced surface barrier. FIG. 4 illustrates a band schematic of a negative electron affinity semiconductor.

Figure 5:
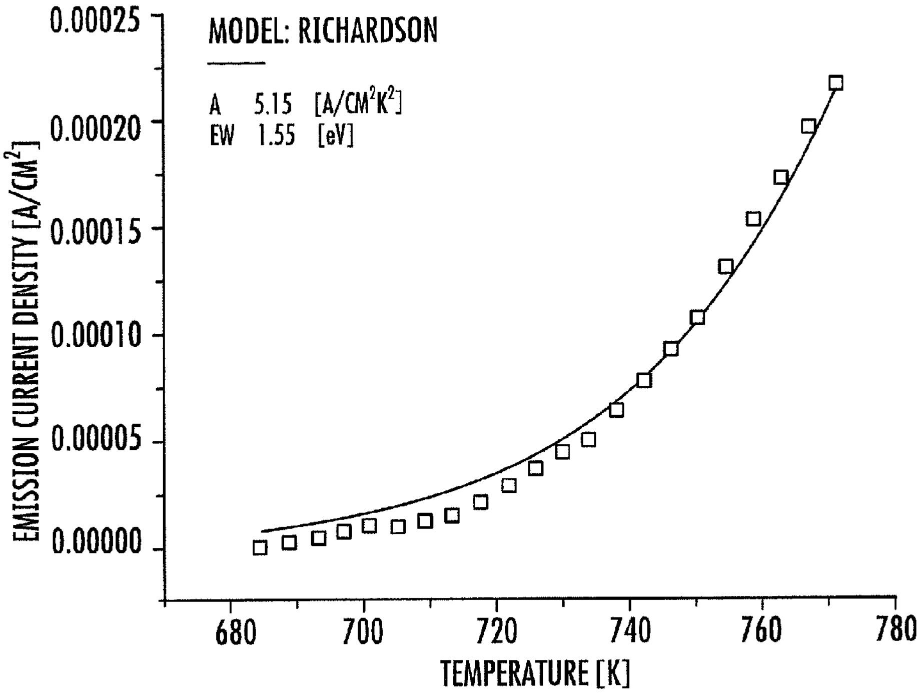
FIG. 5 is a graph of the thermionic emission current density (A/cm$^2$) as a function of temperature (K) for a multilayer, surface treated, nitrogen-doped diamond film according, to embodiments of the present invention.

In FIG. 5, the thermionic electron emission current from a multilayer, surface treated N-doped diamond film with negative electron affinity is shown as a function of temperature. These measurements may indicate that electron emission commences at temperatures as low as 415° C. and increases strongly with temperature. This thermionic emission characteristic has been evaluated with respect to thermionic emission described by the Richardson-Dushman relation:

$$j(T) = A_R T^2 \exp\left[-\frac{\phi}{k_B T}\right]$$

where the emission current j(T) is described as a function of two key parameters, the work function ϕ and the Richardson constant $A_R$. Efficient thermionic emitters are thus characterized by a low work function and a high Richardson's constant.

A comparison between different conventional thermionic emitter materials and a multilayer, surface treated nitrogen doped diamond film emitter is shown in Table 1.

TABLE 1

Comparison of conventional thermionic emitter materials and a multilayer, surface treated nitrogen doped diamond film emitter.

| Material | Richardson's constant [A/cm$^2$ K$^2$] | Work function [eV] |
|---|---|---|
| Tungsten (W) | 60 | 4.54 |
| Thoriated W | 3 | 2.63 |
| Cesium | 162 | 1.81 |
| Tantalum | 60 | 3.38 |

TABLE 1-continued

Comparison of conventional thermionic emitter materials and a multilayer, surface treated nitrogen doped diamond film emitter.

| Material | Richardson's constant [A/cm$^2$ K$^2$] | Work function [eV] |
|---|---|---|
| $LaB_6$ | 40 | 2.4 |
| Multilayer, surface treated N-doped diamond film | 5 | 1.55 |

Figure 6:
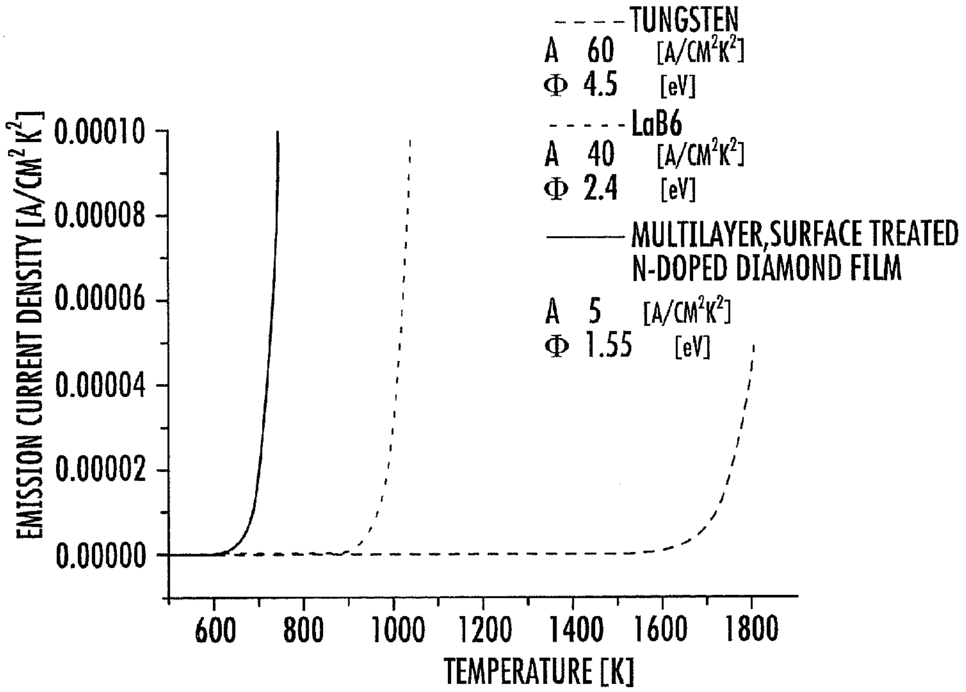
FIG. 6 is a graph of the thermionic emission current density (A/cm$^2$) as a function of temperature (K) comparing conventional thermionic emitters (Tungsten and $LaB_6$ with a multilayer, surface treated N-doped diamond film according to embodiments of the present invention.

In FIG. 6, data related to Table 1 is plotted with respect to the Richardson equation, i.e., the emission current density as a function of temperature. The plot indicates the emission characteristics of the multilayer, surface treated nitrogen doped diamond film emitter according to embodiments of the present invention. At temperatures considerably lower than conventional thermionic emitter materials, a significant emission current can be sustained by this material. This low operating temperature may result in reduced power consumption of devices which would utilize the emitter/collector materials described herein. In addition to energy conservation, the reduced operation temperature may increase the lifetime of the device.

EXAMPLE 2

Sulfur doped nanocrystalline diamond films were synthesized utilizing plasma assisted chemical vapor deposition. The films were deposited on 25.4 mm diameter Mo substrates. Pretreatment included a 30 minute ultrasonic abrasion step in a diamond/titanium/methanol suspension with 0.1 μm diamond and 30 μm titanium powder. (Shima R., Chakk Y., Hoffman A., 2000) The substrate was then rinsed with methanol, dried with nitrogen gas and loaded into the CVD reactor.

The sulfur source was a 50 ppm hydrogensulfide in hydrogen ($H_2S/H_2$) mixture. The emitter films were synthesized with 5 to 40 sccm of the ($H_2S/H_2$) mixture and 20 sccm methane at 2665 Pa chamber pressure, 900 W of microwave power, and ~900° C. substrate temperature. Laser reflectance interferometry was employed to monitor film growth in situ. Sample preparation was concluded by simultaneously terminating gas flows, shutting off the microwave plasma and substrate heating. The final film thickness was determined by in situ laser interferometry to ~0.3 μm.

Carbon nanotube (CNT) films were prepared in the same plasma assisted CVD reactor with sputtered iron as the catalyst and 1 inch diameter molybdenum as substrate material. Precursor gases were ammonia and acytelene and the growth time was 30 minutes (Wang Y. Y., Tang G. Y., Koeck F. M, Brown B., Garguilo J. M., Nemanich R. J., 2004, the disclosure of which is hereby incorporated by reference).

Electron emission measurements from films grown on molybdenum were performed in a thermionic emission system providing an ultra-high vacuum environment for sample characterization. The system includes a radiatively heated sample stage, a cooled, movable (in all 3 spatial directions) collector and a Stanford Research® current/voltage source unit. The base pressure in the chamber was $<6\times10^{-8}$ Pa.

Nanostructured carbon materials, i.e. nanocrystalline, ultrananocrystalline and carbon nanotube (CNT) films exhibit electron emission as a result of a non-uniform distribution of the field enhancement factor β. This singularity can be directly observed in a projection of the emissivity where individual emission sites appear as bright sources. In a different study, the size of a single emission site has been estimated to be ~10 nm while no direct correlation between surface topography and emissivity could be observed (Köck F. A. M., Garguilo J. M., Nemanich R. J., 2004, the disclosure of which is hereby incorporated by reference). This may indicate that field enhancing characteristics are not solely governed by structural properties where high aspect ratio features such as tips exhibit high field enhancement factors.

Figure 7:
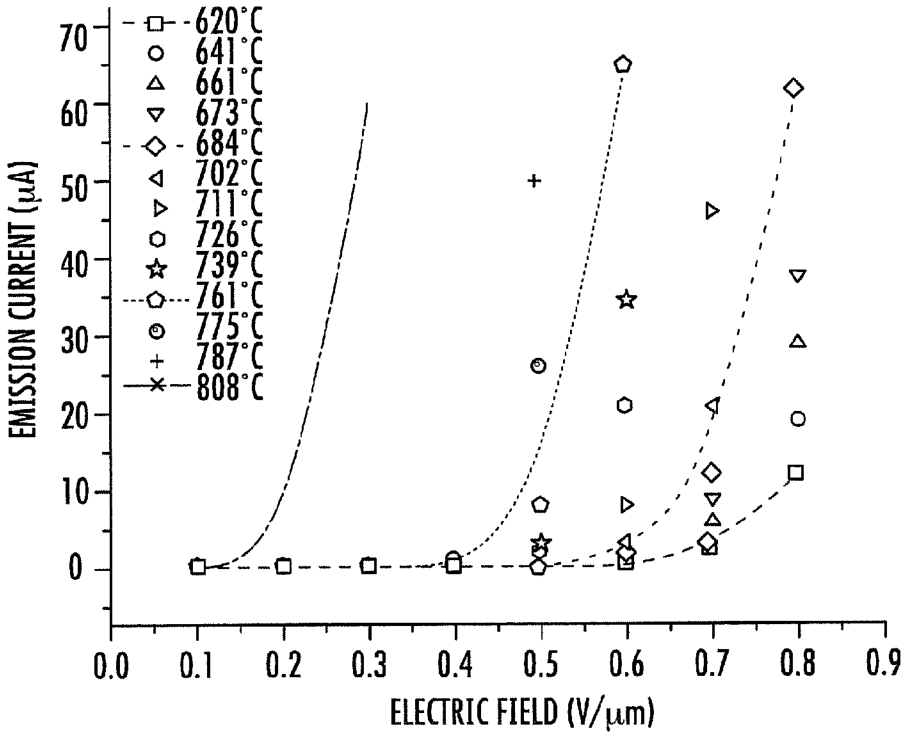
FIG. 7 is a graph of the electron emission current (μA) as a function of electric field (V/μm) for a sulfur doped nanocrystalline diamond film at various temperatures according to embodiments of the present invention.

For a sulfur doped nanocrystalline diamond film on molybdenum current/voltage sweeps were recorded at various temperatures, and the result is shown in FIG. 7. The emission current increases with emitter temperature and with a shift to higher temperatures the emission current increases at a higher rate. Concurrently, the data indicates a diminished threshold field to values considerably less than 1 V/μm. This observed emission behavior may be advantageous in a thermionic energy converter configuration where a small, self generated electric field appears across the vacuum gap. A fraction of this field could then be utilized to exploit the emission behavior of the nanostructured emitter where a lowered threshold field would result in an increased emission current.

Figure 8:
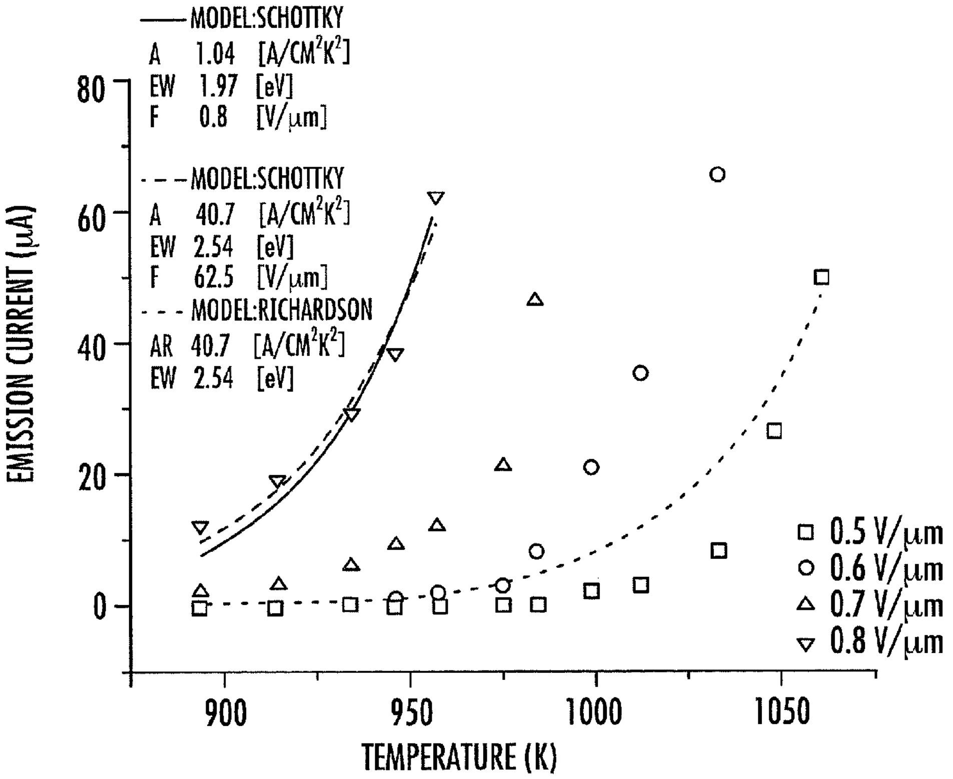
FIG. 8 is a graph of the emission current (μA) as a function of temperature (K) for a suffer doped diamond film at various fields (V/μm) according to embodiments of the present invention. The data is fitted to the Richardson and Schottky equation.

To determine the material properties, the data was fit to the Richardson equation at low electric fields. At an electric field of 0.5 V/μm a fit to the Richardson equation yields a work function of 2.5 eV and a Richardson constant of 40 A/cm$^2$ K$^2$. As the field at the emitter is increased, a shift of the emission current towards higher values is observed. This influence of the field on the emission suggests the use of the field modified Richardson equation, i.e., the Schottky relation. With an applied field of 0.8 V/μm at the emitter, a work function of 1.9 eV and Richardson constant of 1 A/cm$^2$ K$^2$ is computed. A small increase in the electric field may result in a significant reduction in the observed work function. The local field at the emitter can be estimated by evaluating the emission barrier lowering due to field enhancement effects. Computed values for the effective work function and Richardson constant at low fields (0.5 V/μm) are used as input parameters for the Schottky formula and a fit is performed to extract the electric field. In FIG. 8 the data fit (dashed line) represents a local electric field of about 62 V/μm. At an applied electric field of 0.8 V/μm, this corresponds to a field enhancement factor of $\beta\approx78$.

Figure 9:
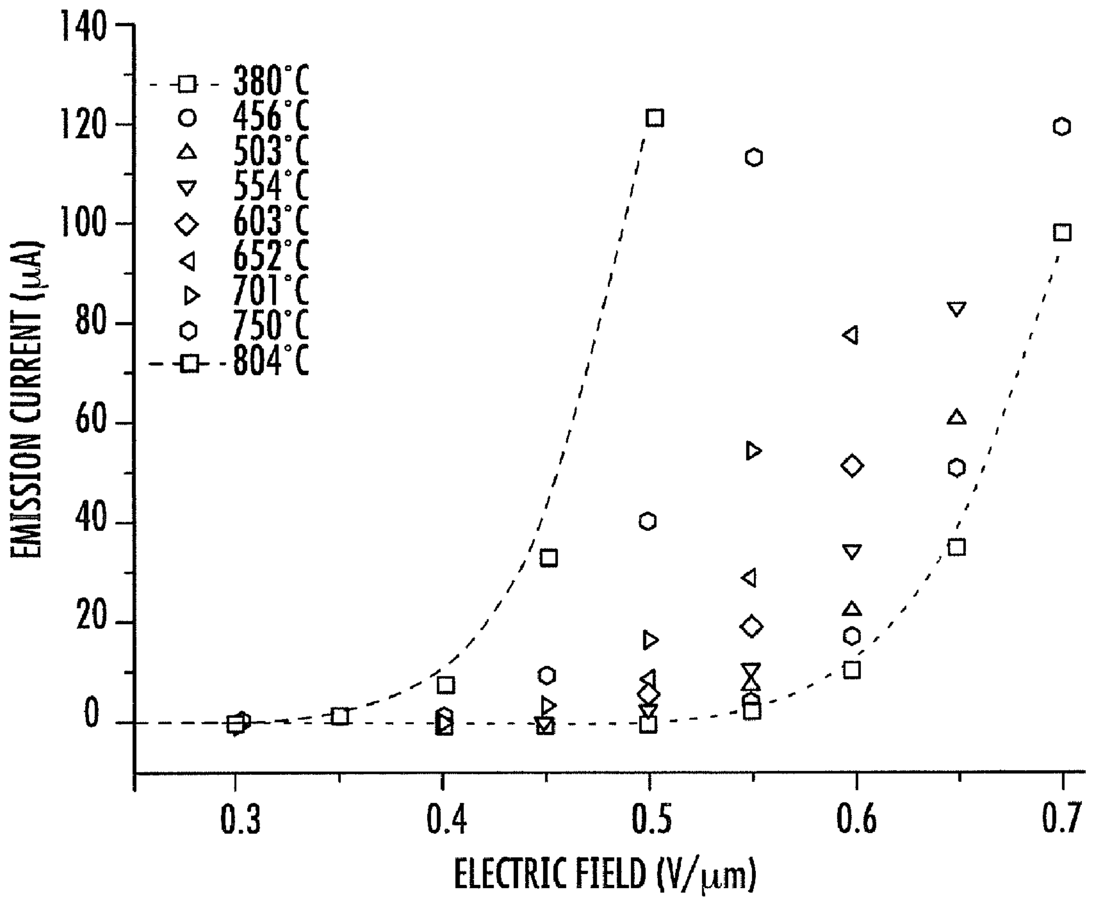
FIG. 9 is a graph of the emission current (μA) as a function of electric field (V/μm) for a carbon nanotube film at various temperatures according to embodiments of the present invention.

The emission characteristics from a CNT film do not differ significantly from its nanocrystalline counterpart where the emission exhibits a strong variation in the spatial distribution of the field enhancement factor. As a result, the emission is localized to bright emission sites. For a CNT film, this localization may be attributed to the geometric structure of the nanotube, i.e. a nanometer sized cylinder with high aspect ratio. This in turn corresponds to a high geometric field enhancement factor. FIG. 9 depicts the emission characteristic of a carbon nanotube film at various temperatures. The emission current increases with the applied field and at elevated temperatures the threshold field is observed to shift towards lower values.

The observed results indicate that sulfur-doped nanocrystalline diamond and CNT films exhibit similar emission characteristics, but the emission origins may be distinguished based on the field enhancement which can be of an electronic and/or geometric nature. While a proposed band structure for sulfur doped nanocrystalline diamond may emphasize the role of dopants and defects in the thermionic emission component, similar electronic properties have not been established for CNT films.

However, these structures can exhibit significant barrier lowering due to an applied field resulting in a reduced effective work function. Moreover, the exact structure of the nanotube, i.e. nanotube body and tip can strongly affect emission properties. For example, simulations have indicated an effective work function ranging from ~1.7 to 5 eV depending on the CNT tip structure. (Chen C. W., Lee M. H., Clark S. J., 2004)

Sulfur doped nanocrystalline diamond and carbon nanotube (CNT) films were synthesized by plasma assisted chemical vapor deposition. These films were characterized for field enhanced thermionic electron emission. The critical material parameters, work function φ and Richardson constant A, were extracted by fitting data to the Richardson and Schottky equation. The work function for sulfur doped nanocrystalline diamond films is significantly altered by the application of an external electric field due to intrinsic field enhancement effects of the material. These induce an enhancement of the local field at the emitting site by a factor of ~78 corresponding to a field of 62 V/μm. As carbon nanotube films exhibit similar emission characteristics, further studies may address an exact origin for emission. Field enhancement structures can thus prove advantageous in a thermionic converter configuration by providing means to alleviate space charge effects.

Nomenclature $\phi$=work function (eV)
$\Phi_E$=emitter work function (eV)
$\Phi_C$=collector work function (eV)
A=Richardson's constant (A/cm$^2$ K$^2$)
J=emission current density (A cm$^{-2}$)
F=electric field (V μm$^{-1}$)
T=Temperature (K)
$\hbar$=reduced Planck's constant (J s)
$\beta$=field enhancement factor
e=electronic charge (C)
m=electronic mass (kg)
$k_B$=Boltzmann's constant (eV K$^{-1}$)

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

REFERENCES

Alvarez-Ramirez, J., Puebla, H., Espinosa, G., "A Cascade Control Strategy for a Space Nuclear Reactor System," *Annals of Nuclear Energy,* 28 (2), pp. 93-112 (2001).

Chen, C. W., Lee, M. H., Clark, S. J. "Field Penetration Induced Charge Redistribution Effects on the Field Emission Properties of Carbon Nanotubes—a First-Principle Study." *Appl. Surf. Sc.,* 228 (1-4), pp. 143-150 (2004).

Dushman, S., "Electron Emission from Metals as a Function of Temperature,"*Phys. Rev.,* 21 (6), pp. 623-636 (1923).

El-Genk, M. S., Momozaki, Y., "An Experimental Investigation of the Performance of a Thermionic Converter with Planar Molybdenum Electrodes for Low Temperature Applications," *Energy Conversion and Management,* 43 (7), pp. 911-936 (2002).

Fowler, R. H. and Nordheim. L. "Electron Emission in Intense Electric Fields,"*Proc. R. Soc. London*, A (119), pp. 173-181 (1928).

Kan, M. C., Huang, J. L., Sung, J. S., Chen, K. H., Yau, B. S., "Thermionic Emission of Amorphous Diamond and Field Emission of Carbon Nanotubes," *Carbon,* 41, pp. 2839-2845 (2003)

Köck, F. A. M., Garguilo, J. M., Nemanich, R. J., "Direct Correlation of Surface Morphology with Electron Emission Sites for Intrinsic Nanocrystalline Diamond Films," *Diamond and Related Materials,* 13 (4-8). pp. 1022-1025 (2004).

Modinos, A., *Field, Thermionic, and Secondary Electron Emission Spectroscopy*, Plenum Press, New York, 1984, p. 12.

Paramonov, D. V., El-Genic, M. S., "A Review of Cesium Thermionic Converters with Developed Emitter Surfaces," *Energy Conversion and Management,* 38 (6) pp. 533-549 (1997).

Richardson, O. W., "Electron Emission from Metals as a Function of Temperature," *Phys. Rev.,* 23, pp. 153-155 (1925).

Shima. R., Chakk, Y., Hoffman A. "Influence of Ti, Fe, and Cu Metal Submicron-Particles on Diamond CVD on Si Substrates," *Carbon,* 38 (13), pp. 1839-1843 (2000).

Soo-Hyung, S., Tae-Hoon, L., Jin-Seok, P., "Roughness Control of Polycrystalline Diamond Films Grown by Bias-Enhanced Microwave Plasma-Assisted CVD," *Diamond and Related Materials,* 12 (10-11), pp. 1670-1674 (2003).

Wang, Y. Y., Tang, G. Y., Koeck, F. M. Brown, B., Garguilo, J. M., Nemanich, R. J., "Experimental Studies of the Formation Process and Morphologies of Carbon Nanotubes with Bamboo Mode Structures," *Diamond and Related Materials,* 13 (4-8), pp. 1287-1291 (2004).

Yoshikawa, H., Morel, C., Koga. Y., "Synthesis of Nanocrystalline Diamond Films Using Microwave Plasma CVD," *Diamond and Related Materials,* 10 (9-10), pp. 1588-1591 (2001).

Zhang. J. H., Feng, T., Yu, W. D. Nu, X. H., Xang, W., Li, Q., "Enhancement of Field Emission from Hydrogen Plasma Processed Carbon Nanotubes," *Diamond and Related Materials,* 13 (1), pp. 54-59 (2004).

That which is claimed is:

1. A thermionic electron emitter/collector comprising:

a substrate; and a doped diamond electron emitter/collector layer on the substrate, the doped diamond electron emitter/collector layer having at least a first and a second n-type doping concentration as a function of depth such that the first n-type doping concentration is different from the second n-type doping concentration.

2. The thermionic electron emitter/collector of claim 1, further comprising an electrode spaced apart from the doped diamond electron emitter/collector layer and configured to generate a current between the electrode and the doped diamond electron emitter/collector layer upon the application of thermal energy to the substrate.

3. The thermionic electron emitter/collector of claim 1, further comprising a passivation layer on the diamond electron emitter/collector layer opposite the substrate.

4. The thermionic electron emitter/collector of claim 3, wherein the passivation layer comprises hydrogen and/or deuterium and/or a metal, and/or metal oxide.

5. The thermionic electron emitter/collector of claim 1, wherein the substrate comprises a metal.

6. The thermionic electron emitter/collector of claim 5, wherein the metal comprises molybdenum and/or tungsten.

7. The thermionic electron emitter/collector of claim 1, wherein the substrate comprises silicon.

8. The thermionic electron emitter/collector of claim 1, further comprising a nucleation layer between the doped diamond electron emitter layer and the substrate.

9. The thermionic electron emitter/collector of claim 8, wherein the nucleation layer comprises graphite and/or a carbon species with graphitic bonding including $sp^2$ bonding.

10. The thermionic electron emitter/collector of claim 8, further comprising a low electrical resistivity interfacial layer between the nucleation layer and the substrate.

11. The thermionic electron emitter/collector of claim 10, wherein the low electrical resistivity interfacial layer comprises a carbide.

12. The thermionic electron emitter/collector of claim 1, wherein the doped diamond emitter/collector layer has a Richardson constant greater than about 1 $A/cm^2K^2$.

13. The thermionic electron emitter/collector of claim 1, wherein the doped diamond emitter/collector layer has a work function of less than about 2 eV.

14. The thermionic electron emitter/collector of claim 1, wherein a region of the emitter/collector layer corresponding to the first n-type doping concentration has a dopant that is different from another region of the emitter/collector corresponding to the second n-type doping concentration.

15. The thermionic electron emitter/collector of claim 1, wherein the first and second n-type doping concentrations comprise dopants selected from the group consisting of nitrogen, sulfur, phosphorus, lithium, and combinations thereof.

16. The thermionic electron emitter/collector of claim 1, wherein the first n-type doping concentration defines a first region of the doped diamond electron emitter/collector layer and the second n-type doping concentration defines a second region of the doped diamond electron emitter/collector layer that is in direct contact with the first region.

17. The thermionic electron emitter/collector of claim 16, wherein the first and second n-type doping concentrations are between about $10^{17}$ $cm^{-3}$ and about $10^{21}$ $cm^{-3}$.

18. The thermionic electron emitter/collector of claim 1, wherein the first and second n-type doping concentrations define a doping gradient that changes as a function of depth.

19. The thermionic electron emitter/collector of claim 1, wherein the doped diamond electron emitter/collector layer is a planar layer.

20. A method of forming a thermionic emitter/collector, comprising:

forming a doped diamond electron emitter/collector layer on a substrate, the doped diamond electron emitter/collector layer comprising a first n-type doping concentration and a second n-type doping concentration as a function of depth such that the first n-type doping concentration is different from the second n-type doping concentration.

21. The method of claim 20, further comprising an electrode spaced apart from the doped diamond electron emitter/collector layer and configured to generate a current between the electrode and the doped diamond electron emitter/collector layer upon the application of thermal energy to the substrate.

22. The method of claim 20, further comprising forming a passivation layer on the diamond electron emitter/collector layer opposite the substrate.

23. The method of claim 22, wherein the passivation layer comprises hydrogen and/or deuterium and/or a metal and/or metal oxide.

24. The method of claim 20, wherein the substrate comprises a metal.

25. The method of claim 24, wherein the metal comprises molybdenum and/or tungsten.

26. The method of claim 20, wherein the substrate comprises silicon.

27. The method of claim 20, further comprising forming a nucleation layer between the doped diamond electron emitter layer and the substrate.

28. The method of claim 27, wherein the nucleation layer comprises graphite and/or a carbon species with graphitic bonding including $sp^2$ bonding.

29. The method of claim 27, further comprising a low electrical resistivity interfacial layer between the nucleation layer and the substrate.

30. The method of claim 29, wherein the low electrical resistivity interfacial layer comprises a carbide.

31. The method of claim 20, wherein the doped diamond emitter/collector layer has a Richardson constant less than about 10 $A/cm^2K^2$.

32. The method of claim 20, wherein the doped diamond emitter/collector layer has a work function of less than about 2 eV.

33. The method of claim 20, wherein a region of the emitter/collector layer corresponding to the first doping n-type concentration has an n-type dopant that is different from another region of the emitter/collector corresponding to the second n-type doping concentration.

34. The method of claim 20, wherein the first and second n-type doping concentrations comprise dopants selected from the group consisting of nitrogen, sulfur, phosphorus, lithium, and combinations thereof.

35. The method of claim 20, wherein the first n-type doping concentration defines a first region of the doped diamond electron emitter/collector layer and the second n-type doping concentration defines a second region of the doped diamond electron emitter/collector layer that is in direct contact with the first region.

36. The method of claim 35, wherein the first and second n-type doping concentrations are between about $10^{17}$ $cm^{-3}$ and about $10^{21}$ $cm^{-3}$.

37. The method of claim 20, wherein the first and second n-type doping concentrations define a doping gradient that changes as a function of depth.

38. A thermionic electron emitter/collector comprising:

a substrate; and a doped boron nitride electron emitter/collector layer on the substrate, the doped boron nitride electron emitter/collector layer having at least a first and a second n-type doping concentration as a function of depth such that the first n-type doping concentration is different from the second n-type doping concentration.

39. The thermionic electron emitter/collector of claim 38, wherein the first and second n-type doping concentrations comprise dopants selected from the group consisting of carbon, silicon, or germanium or oxygen, sulfur, or selenium, and combinations thereof.

40. The thermionic electron emitter/collector of claim 38, wherein the first n-type doping concentration defines a first region of the doped boron nitride electron emitter/collector layer and the second n-type doping concentration defines a second region of the doped boron nitride electron emitter/collector layer that is in direct contact with the first region.

41. The thermionic electron emitter/collector of claim 40, wherein the first and second n-type doping concentrations are between about $10^{17}$ $cm^{-3}$ and about $10^{21}$ $cm^{-3}$.

42. The thermionic electron emitter/collector of claim 38, wherein the first and second n-type doping concentrations define a doping gradient that changes as a function of depth.

43. The thermionic electron emitter/collector of claim 38, wherein the doped boron nitride electron emitter/collector layer is a planar layer.

44. The thermionic electron emitter/collector of claim 38, wherein the substrate comprises silicon.

45. The thermionic electron emitter/collector of claim 38, further comprising forming a nucleation layer between the doped diamond electron emitter layer and the substrate.

46. The thermionic electron emitter/collector of claim 45, wherein the nucleation layer comprises graphite and/or a carbon species with graphitic bonding including $sp^2$ bonding.

47. The thermionic electron emitter/collector of claim 45, further comprising a low electrical resistivity interfacial layer between the nucleation layer and the substrate.

* * * * *